United States Patent [19]

Bergmann et al.

[11] 4,324,803
[45] Apr. 13, 1982

[54] PROCESS FOR DEPOSITING ON SUBSTRATES, BY CATHODE SPUTTERING, A SELF-LUBRICATING COATING OF METAL CHALCOGENIDES AND THE COATING OBTAINED BY THIS PROCESS

[75] Inventors: Erich Bergmann, Bienne; Georges Melet, Meyrin, both of Switzerland

[73] Assignee: Battelle Memorial Institute, Carouge, Switzerland

[21] Appl. No.: 196,483

[22] PCT Filed: Oct. 8, 1979

[86] PCT No.: PCT/CH79/00132

§ 371 Date: Jun. 9, 1980

§ 102(e) Date: May 20, 1980

[87] PCT Pub. No.: WO80/00712

PCT Pub. Date: Apr. 17, 1980

[30] Foreign Application Priority Data

Oct. 9, 1978 [CH] Switzerland ............... 10455/78

[51] Int. Cl.³ ..................... B32B 9/00; C23C 15/00
[52] U.S. Cl. .................................. 428/472; 428/698; 204/192 C; 204/192 EC; 368/124; 368/324

[58] Field of Search .......... 204/192 C, 192 SP, 192 S, 204/192 P, 192 EC; 428/472, 689, 698; 368/124, 324

[56] References Cited

PUBLICATIONS

T. Spalvins, "Tribological Properties of Sputtered MoS₂ Films In Relation to Film Morphology", *Thin Solid Films*, vol. 73, pp. 291-297, (1980).
K. A. B. Andersson et al., "Morphologies of RF Sputter-Deposited Solid Lubricants", *Vacuum*, vol. 27, pp. 379-382, (1977).
R. I. Christy et al., "RF Sputtered MoS₂ Parameter Effects on Wear Life", *Thin Solid Films*, vol. 64, pp. 223-229, (1979).
N. W. Price et al., "Sputtered Molybdenum Disulphide as a Lubricant for Instrument Slip Rings", *Thin Solid Films*, vol. 11, pp. 191-194, (1972).

*Primary Examiner*—Aaron Weisstuch
*Attorney, Agent, or Firm*—Karl F. Ross

[57] ABSTRACT

A metal chalcogenide coating, in particular of molybdenum sulphide, is deposited on a substrate by high speed cathode sputtering. This coating is turbostratic and has an unusually high resistance to wear produced by frictional forces.

12 Claims, 5 Drawing Figures

PROCESS FOR DEPOSITING ON SUBSTRATES, BY CATHODE SPUTTERING, A SELF-LUBRICATING COATING OF METAL CHALCOGENIDES AND THE COATING OBTAINED BY THIS PROCESS

FIELD OF THE INVENTION

The present invention relates to a process that can be used to coat substrates, by cathode sputtering, with a self-lubricating layer of metal chalcogenides, a composition for carrying out this process, and a self-lubricating coating resulting from the implementation process.

By metal chalcogenides are meant here metal sulphides, selenides and tellurides, in particular the sulfides, selenides and tellurides of Mo, W, Nb, V, Zr, Ti and Ta, whose normally crystalline and lamellar structure enables layers of a low coefficient of friction to be formed that can be used to coat metal objects in dry frictional contact with one another, while facilitating sliding and reducing wear.

BACKGROUND OF THE INVENTION

The deposition by cathode sputtering of anti-friction layers of molybdenum sulphide is already known. Thus, for example, Spalvins (ASLE Transactions 14, (4), 267-274 (1971); NASA TM X-71742 (1975) describes the deposition of such layers on highly polished metal surfaces ($5 \times 10^{-2}$ $\mu$m surface roughness) by using the technique known as radio frequency sputtering and DC polarization. Spalvins used a target of pure $MoS_2$ and worked under conditions enabling self-lubricating, amorphous or microcrystalline adherent deposits to be obtained on various substrates (Ni, Au, Ag, Co, Mo, W, Ti, Al, steels, glass and certain synthetic resins), at a rate of about 0.015 $\mu$m per minute. Such films had coefficients of friction (measured in a high vacuum by means of the "disc and ball" device described hereinafter) of the order of 0.03 to 0.04 for thicknesses of 0.2 to 0.65 $\mu$m. However, this process has certain disadvantages. Thus, on account of the low efficiency of the process it is virtually impossible to obtain deposits having a thickness substantially greater than 0.5 to 1 $\mu$m, and it has a tendency to form excrescences of $MoS_2$ on the uneven parts of the substrates, which means that the substrates to be plated have to be extremely highly polished if industrially usable anti-friction coatings are to be obtained. Furthermore, the structure of the deposits does not provide very favorable wear resistance properties, especially in the presence of moisture. Finally, and the reason for this is unknown, the deposits obtained by the Spalvins method do not adhere to copper and bronze, which is a serious disadvantage in the case of anti-friction coatings intended for bearings or small mechanical parts, often manufactured from brass or bronze.

SUMMARY OF THE INVENTION

The process of the invention obviates these disadvantages, and is characterised by the fact that the cathode space of the target (that is to say the region where the phenomena leading to the formation of the ions responsible for sputtering take place) is subjected to a magnetic field, that the distance between this target and the substrate to be coated is adjusted to correspond to the mean free path of the sputtered fragments of the target (in general from 1.5 to 7 cm depending on the sputtering pressure, which generally varies between $2 \times 10^{-3}$ and $8 \times 10^{-4}$ mm Hg), and that the density of the sputtering current is adjusted such that the deposition rate on the surface of the substrate opposite the target is at least 0.1 $\mu$m per minute. Under these conditions the deposit is uniform and regular and particular attention need not be paid to the surface state of the substrate before coating. On the contrary, it has been found that a certain degree of roughness of the substrate promotes the adherence of the self-lubricating deposits.

In addition, the composition of the coatings obtained by cathode sputtering does not in general faithfully reproduce that of the target material, and very often the deposits of $MoS_2$ obtained from atomized $MoS_2$, in conventional systems, are frequently deficient in sulphur and rich in molybdenum, or vice versa, and their physical properties may thereby be affected.

The sputtering composition of the invention obviates these disadvantages.

This composition comprises, mixed with the metal chalcogenide or chalcogenides to be deposited, an excess of at least one of the metal or metalloid components of the latter in the elementary state, the whole being in the form of a compacted powder placed in the cathode receptacle of the atomization device and constituting the target of the latter.

The chalcogen or free metal content of the cathode sputtering composition of the invention may vary widely depending on requirements, which are of course a function of the operating conditions of the article being treated. For example, in the case of molybdenum sulphide the composition may contain, in the form of a powder mixture, pure $MoS_2$ with 0.001% to a few percent elemental sulphur or molybdenum, the exact amount of these elements depending on the operating conditions of atomization and on the predetermined composition of the deposit which it is desired to obtain (a deposit poor in sulphur, one corresponding stoichiometrically to the formula $MoS_2$, or one rich in sulphur). It will be seen hereinafter that an exact relationship has been established between the composition of the target and that of the deposit of the other chalcogenides and their mixtures with one or more free chalcogenides. Thus, for example, the process is suitable for depositing mixed layers of molybdenum and selenium sulphides that may contain an excess of sulphur, of selenium, or of both these metalloids.

In the process according to the invention, the magnetic field to which the cathode space is subjected may be produced by a permanent magnet forming part of the cathode support (e.g. a "cathode magnetron" device, as described for example in the following publication: Catalogue VIDE 1976, la Physique Appliquée Industrie, 16 rue André-Ampère, 700-95004 Cergy, France). Moreover, the cathode sputtering device enabling the present process to be implemented may be any commercial apparatus having the appropriate characteristics and properties. The "S-GUN thin film source" apparatus produced by VARIAN, Palo-Alto, Calif., may be mentioned by way of example.

The reason why the present process does not give rise to the formation of excrescences as in the prior art processes is not known exactly. It is believed that this effect is related to the deposition rate, which is very much greater than that of the old processes.

In order to achieve such deposition rates, the process is advantageously carried out with a cathode voltage of 400 to 800 volts and with a cathode current density of 5 to 20 mA/cm$^2$, the magnetic field being of the order of 45 to 100×10$^3$ A/m.

In order to prepare the composition of the invention in its target form for cathode sputtering, the powdered chalcogenide is mixed, for example in the case of a chalcogenrich product, with the chalcogen, likewise in powder form, a suitable recessed area of the cathode is filled with this mixture, and the whole is subjected to a high pressure, for example of the order of 0.5 to 1 ton/cm$^2$, so that the powder is compacted into a block.

For the practical implementation of the present process, the following procedure is advantageously adopted: the parts to be plated (these may be small sample or specimen plates, or mechanical parts) are selected, mechanically scraped and cleaned by a conventional process, and arranged on the substrate holder of a cathode sputtering apparatus. Those regions of the parts that are not to be plated may if necessary be masked (by a screen, mask or a perforated object holder). The target holder containing the compacted composition is secured to the cathode support, the apparatus is closed, and a vacuum is applied. A rare gas (Ar, Kr, Xe) is then introduced under a pressure of the order of 10$^{-2}$ mm Hg, a voltage is applied to the apparatus, and a preliminary ion scouring of the substrates is carried out by polarizing the latter in a suitable manner. The pressure is then reduced to between about 2×10$^{-3}$ and 8×10$^{-4}$ mm Hg, the cathode is polarized under a voltage between the above voltage values, and the actual sputtering is commenced, the scouring operation being stopped only after the whole procedure in order to prevent the impurities released during the scouring from being redeposited on the parts at the start of the sputtering operation. Deposition is continued until a film having a thickness of about 0.2 to 3 μm is obtained, thicknesses of the order of 1.5 μm being the most suitable from the point of view of lubrication. These deposits may be produced at various temperatures by heating the substrates by means of a resistance heater incorporated in the object holder. However, the process is preferably carried out at normal temperature, the deposits obtained under these conditions having a crystalline structure that is satisfactory for the intended use.

The nature of the material of the substrates may be chosen as desired. In practice, parts made of brass, copper, various steels, gold, nickel, manifor (a Mn-Ni-Cu alloy), etc., have been coated by the present process, and no marked differences have been observed in the properties of the deposits as a function of the substrate.

The self-lubricating coatings obtained according to the process of the invention either have a lamellar microcrystalline structure, such as MoSe$_2$, are amorphous, such as MoTe$_2$ and TaSe$_2$, or are "turbostratic", such as NbSe$_2$, MoS$_2$ and WS$_2$. The turbostratic form, defined hereinafter, constitutes a particularly useful form of self-lubricating deposit on account of its remarkable abrasion resistance, the long working life of friction parts provided with such a deposit, and the fact that it is unaffected by external climatic conditions, in particular ambient humidity.

The "turbostratic" structure, which may be detected by the X-ray diffraction spectra (presence of a single 002 index peak, whereas the crystalline lamellar state is distinguished by the presence of several peaks, for example 110, 105, 103, 100, 002, and the amorphous state by the absence of peaks), is defined by the inventors in the following manner:

In common substances such as metals or ceramics, the degree of crystallinity may run from a single crystal state through increasingly fine polycrystalline states, and finally reach the so-called "amorphous" state. These states are more or less isotropic, that is to say have properties that are practically uniform in all directions.

In a layered lamellar structure (laminated structure), such as MoS$_2$, graphite, mica, etc., the properties are extremely anisotropic from the very start. In the interior of the "sheets" (in this context we shall define a "sheet" as a crystalline layer of monomolecular thickness) the bonds are covalent, and between the sheets the bonds are of the Van der Waals type, which means that these substances are easily cleavable. Thus, the crystallization states are different from those mentioned above. Here, a single crystal is effectively an array of single crystals in two dimensions. In a series in which there is a decrease in the degree of crystallization, it is on the one hand the lateral dimension of the sheets and on the other hand the relative coordination of the orientation of the different sheets (or small packets of sheets) which is reduced. This stage is called a "turbostratic" state. The perpendiculars to all the sheets are practically parallel, but the rotation around any such perpendicular is arbitrary. Thus, even in a state having a low degree of crystallization, the whole deposition layer is strongly anisotropic. The crystallization may become reduced to a practically isotropic "amorphous" state in which all that remains of the sheets has the dimension of a small group of atoms. The "turbostratic" state is also defined by W. BOLLMANN in Electron Microscope Study of Radiation Damages in Graphite, J. Appl. Physics 32, 869–876 (1961).

SPECIFIC DESCRIPTION

EXAMPLE 1

Figure 1:
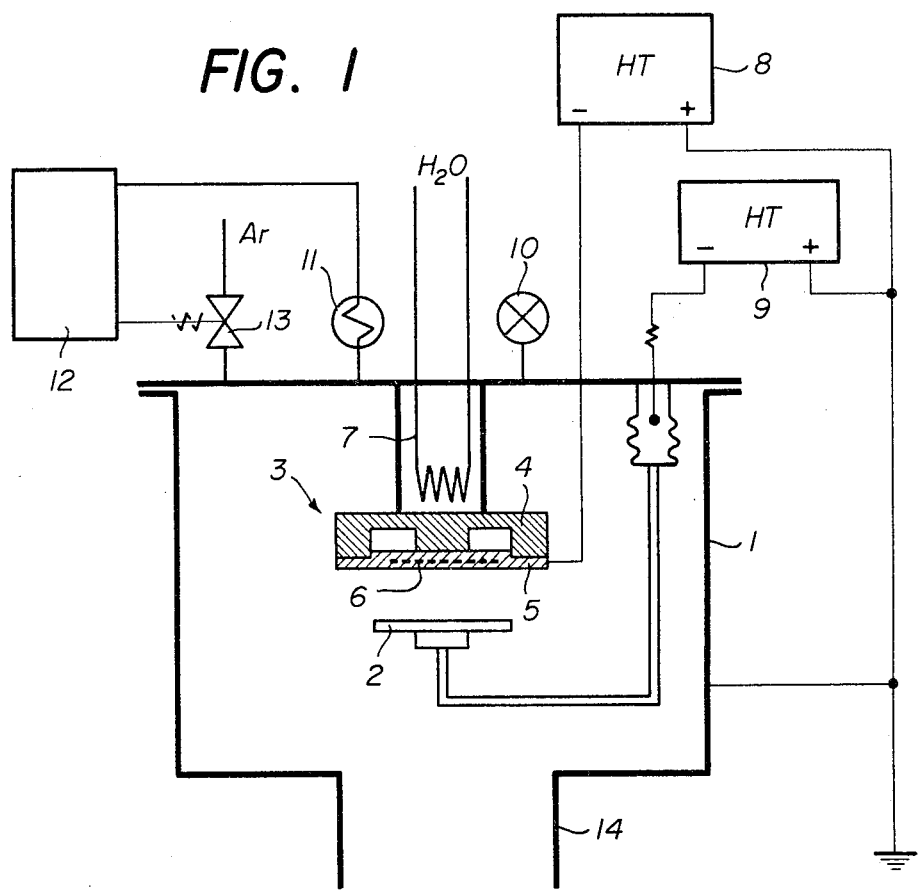
FIG. 1 is a diagram of a cathode sputtering installation.

Three powders A, B and C intended to form the targets of a cathode sputtering apparatus are prepared in the following manner:

A: 20 g of molybdenum sulphide (MERCK, purest quality) are used, whose analysis shows that it contains 61.96% Mo and 38.03% S, other elements being undetectable by the analytical methods employed (gravimetry). In actual fact, this composition does not correspond exactly to pure MoS$_2$ (which should contain 59.94% of Mo and 40.06% of S), but rather to a molybdenum sulphide containing a slight excess of free metal (calculated formula Mo$_{1.089}$S$_2$).

B: 1.74 g of pure sulphur (FLUKA) is added to another batch of 20 g of molybdenum sulphide of the composition A above so as to raise the total sulphur concentration to 43%.

C: The same procedure is adopted with a third batch, 4.08 g of S being added to 20 g of molybdenum sulphide (MERCK) so as to raise the concentration of sulphur to 48.5%.

The three compositions are each passed through a combined crusher and mixer so as to produce intimately mixed fine powders.

The powder A is then introduced into the cavity of a target holder disc of a cathode sputtering apparatus (plate made of A1 or non-corrodible substance 5 mm thick and provided with a circular groove 60 mm in diameter and 2 mm deep). The powder is distributed uniformly and compacted, a small disc of non-stick paper is placed in position, and the powder is subjected to a pressure of 0.6 ton/cm² as produced by the piston of a hydraulic press. After a few seconds a homogeneous and solid cake of compacted powder is obtained.

Also, a certain number of small sample plates adapted to the substrate holder of the cathode sputtering apparatus are chosen. These small plates, which are rectangles of dimensions $40 \times 20 \times 1$ mm or discs of diameter 17 mm, and of thickness 1.4 mm, are chosen from cooper, brass, bronze, iron, nickel and manifor, and are placed in the substrate holder so as to obtain a deposit by atomization. The following methods are used to prepare the surfaces of these small plates:

Polishing 1 (P-1): Coarse polishing with an abrasive strip of 125 $\mu$m

Polishing 2 (P-2): Finer polishing with a paste of 15 $\mu$m

Polishing 3 (P-3): Fine polishing with a final paste of 0.25 $\mu$m.

After the polishing, the small plates were mechanically scoured, next degreased in hot trichloroethylene (5 minutes), and then rinsed in alcohol and dried.

The cathode sputtering apparatus used is shown diagrammatically in FIG. 1. This apparatus comprises an airtight chamber 1 containing a substrate holder 2 and a cathode 3. This cathode comprises, as regards the essential parts (only these are shown here), a magnet 4, a target holder plate 5 having a recess 6 filled with the compacted powder to be atomized, as has been described above and, in order to cool the whole system, a liquid coolant circulation 7, for example H₂0. The apparatus is fed by two high voltage sources, one source 8 to polarize the cathode and the other source 9 to polarize the substrates during the preliminary ion scouring.

Finally, with regard to the supply of rare ionization gas, the apparatus also comprises a pressure gauge 10, and a self-regulating device for the pressure, consisting of a control gauge 11 controlling an electronic regulator 12 that actuates an inlet valve 13 for the gas (for example Ar) so as to maintain the pressure of the gas at a predetermined constant value during the atomization. In addition, the apparatus also comprises an evacuation line 14 joined to a vacuum pump, not shown.

The parts of the apparatus can include the following commercially available products:

High voltage supply (3): 0 to 2.4 KV, current up to 400 mA.

High voltage supply (9): WITTMER 0-2000 V generator, current up to 30 mA, separated from the substrate holder by 100 k$\Omega$.

Gauge (10): HASTINGS DV6-M thermocouple gauge

Gauge (11): PIRANI BALZERS NV4

Regulator (12): BALZERS RVG2 control box

Valve (13): BALZERS RV27E

After the small plates have been arranged on the substrate holder 2, the target holder containing the compacted powder A is fixed to the cathode 3 and the distance between the latter and the substrate is adjusted so that it corresponds to the mean free path of the particles of the sputtered material, that is to say about 3 to 6 cm under the operating conditions of the present example. The apparatus is closed and a vacuum ($10^{-5}$–$10^{-6}$ mm Hg) is applied with a BALZERS PST 900 A type diffusion pump.

99.9% pure argon from a cylinder is then introduced via the valve 13 and the pressure is adjusted to $5 \times 10^{-2}$ mm Hg. The object holder is polarized and the small substrate plates are ionically scoured for 6 minutes under a current of 2 mA. The argon pressure is then adjusted to $2 \times 10^{-3}$ mm Hg, without switching off the scouring current, and the sputtering current is switched on so that the two effects are superimposed, to prevent the scouring products from being redeposited on the substrate. After a few seconds the scouring current is switched off and the deposition is allowed to continue under a target current density of 7 mA/cm², which gives a deposition rate of 0.1 $\mu$m/minute.

When it is determined that about 1.5 to 1.8 $\mu$m of self-lubricating product has been deposited, the operation is stopped and the small plates are removed from the apparatus and subjected to analysis and friction tests, and the same operation is repeated on other substrates, using the compositions B and C successively as targets.

The whole procedure is then carried out on other small plates, allowing the sputtering to take place for different periods of time so as to obtain an entire range of samples of various materials covered with films of different compositions and thicknesses and deposited on surfaces having different finishes.

Figure 2:
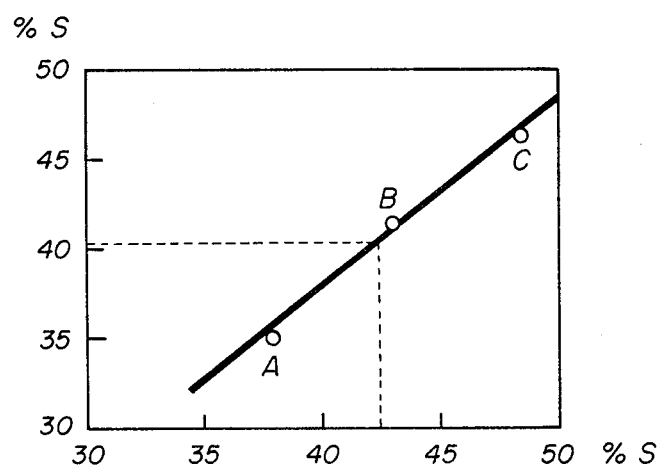
FIG. 2 is a graph showing the relationship between the percentage of sulphur in the compositions, according to the invention, for the MoS$_2$ deposit, and that of the said deposits obtained by cathode sputtering.

The chemical compositions of the deposits have been analysed and plotted on a graph as a function of the compositions of the corresponding powders used as the target (see FIG. 2). It can be seen from this graph that, under the afore-mentioned operating conditions, there is a practically linear relationship between the composition of the starting mixtures and that of the coatings. It can also be seen that a sputterable composition containing 42.8% of sulphur corresponds to a deposit containing 40.06% of sulphur (stoichiometric amount corresponding to the formula MoS₂).

These samples were subjected to the following friction tests:

I. "Disc and ball" test: The apparatus used for this test, one form of which is described in ASLE transactions 14, (4), 267-274, comprises a support disc on which the sample being tested is mounted in the form of a small circular plate against which is applied a ball thrust device whose pressure on the sample can be regulated and which includes a set of strain gauges enabling the frictional force between the ball and sample to be measured. The disc is rotated at a predetermined velocity and the number of revolutions or the time required to erode the deposit (that is to say, to cause a marked increase in the frictional force) under a predetermined pressure of the ball is recorded. The following parameters were used for the present "disc and ball" tests:

Ball 0.7 mm in diameter, of steel or synthetic ruby; displacement rate 1 cm/second; load 56 kg/mm²; ambient temperature and pressure.

II. Barker Pendulum: This pendulum consists of a rigid metal beam provided with an adjustable weight and whose pivoting means (a spherical ball-and-socket joint) rests between two plane surfaces arranged in the form of a V, the angle of the latter being 90°. To carry out the measurement, the coatings being tested are placed on the surfaces of the V in contact with the ball-and-socket joint, the arm of the pendulum is displaced from its equilibrium position by an angle defined by a graduated scale, the arm is released so that it starts to oscillate, and, after a set number of swings, the value of the amplitude of the last oscillation is read. The coefficient of friction $\eta$ is related to the above parameters by the following relationship:

$$\eta = K \cdot \frac{Ao - Af}{N}$$

where Ao=initial amplitude; Af=final amplitude; N=number of swings; K=coefficient depending on the weight of the pendulum. In the present case K=0.0735 (weight of 1 kg).

The thickness of the deposits was measured by interferometry in accordance with the conventional methods and, more especially, by the "TALYSURF" method. In this method, a comparator recorder is used whose slide moves linearly over the surface being investigated and which records the differences in level (amplifying them strongly) met by the slide. In order to measure the thickness of a deposit, a metal thread is previously applied to the substrate, before coating, and once the film has been deposited the thread is removed and leaves a trace whose depth corresponds to the thickness being measured.

The results of the above tests on various coating samples prepared in accordance with the present example enabled a relationship to be established between the self-lubricating properties of the "turbostratic" molybdenum sulphide deposits and the following variables: surface state of the substrate, thickness of the deposit, and composition of the latter.

Figure 3:
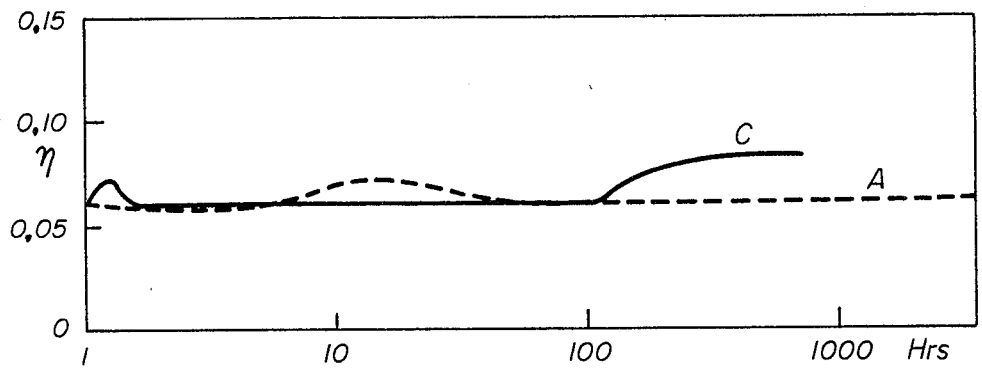
FIG. 3 is a graph showing the variation in the coefficient of friction η of two deposits of MoS$_2$ as a function of the friction time.

Thus, FIG. 3 shows the variation in the coefficient of friction with time according to the "disc and ball" test of a coating A of 1 $\mu$m (obtained from the composition A above) and of a coating C of 1.1 $\mu$m (obtained from the composition C) on a finely polished steel substrate (method P-3). In this test it is found that the low sulphur content coating A preserves its self-lubricating properties (>6000 hours) longer than the sulphur-rich coating C (~100 hours). In addition, coatings of a comparable thickness obtained by conventional means (see for example the atomisation deposition methods described in the first two references cited in the introduction, and also the following reference: G. ROCHAT et al; Solid lubrication of small moving mechanical parts, L.S.R.H. Conference No F 2.6, CIC, Geneva, 1979) have also been subjected to a similar treatment, and it has been found that the wear resistance of such deposits was considerably worse than that of the turbostatic deposits of the invention. In fact, the conventional self-lubricating coatings lose their properties after a period of the order of only 120 to 150 hours.

Figure 4:
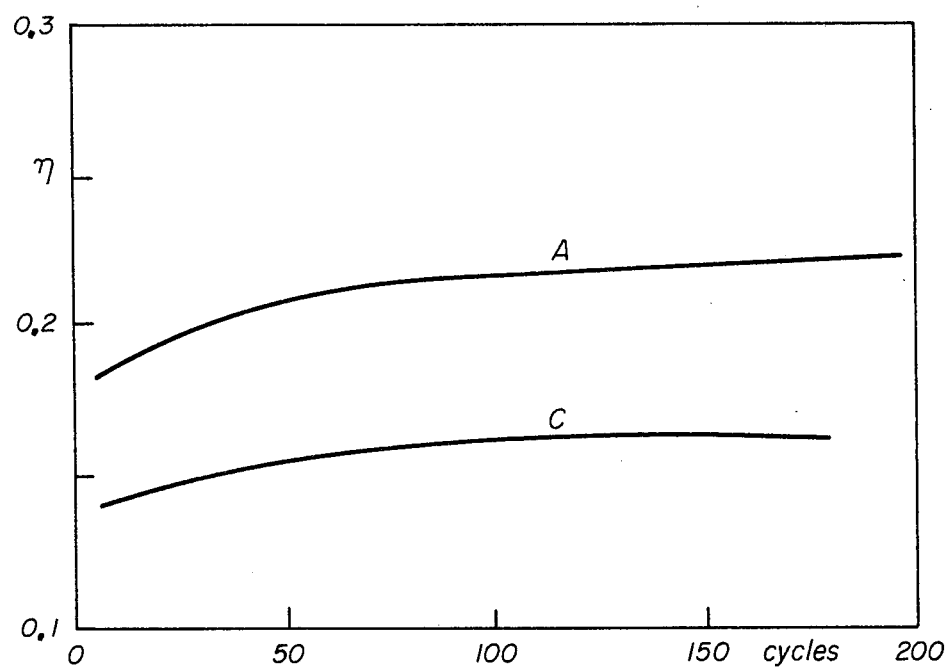
FIG. 4 is a graph of the same type as that shown in FIG. 3.

However, for two identical coatings deposited on brass (polishing P-3), it has been found that the composition C gives a more slippery coating than the composition A. This state of affairs is illustrated in FIG. 4, in which the variation in $\eta$ has been plotted as a function of the number of cycles in the Barker pendulum test (dotted curve=results obtained with the coating A; continuous curve=results obtained with the coating C).

Figure 5:
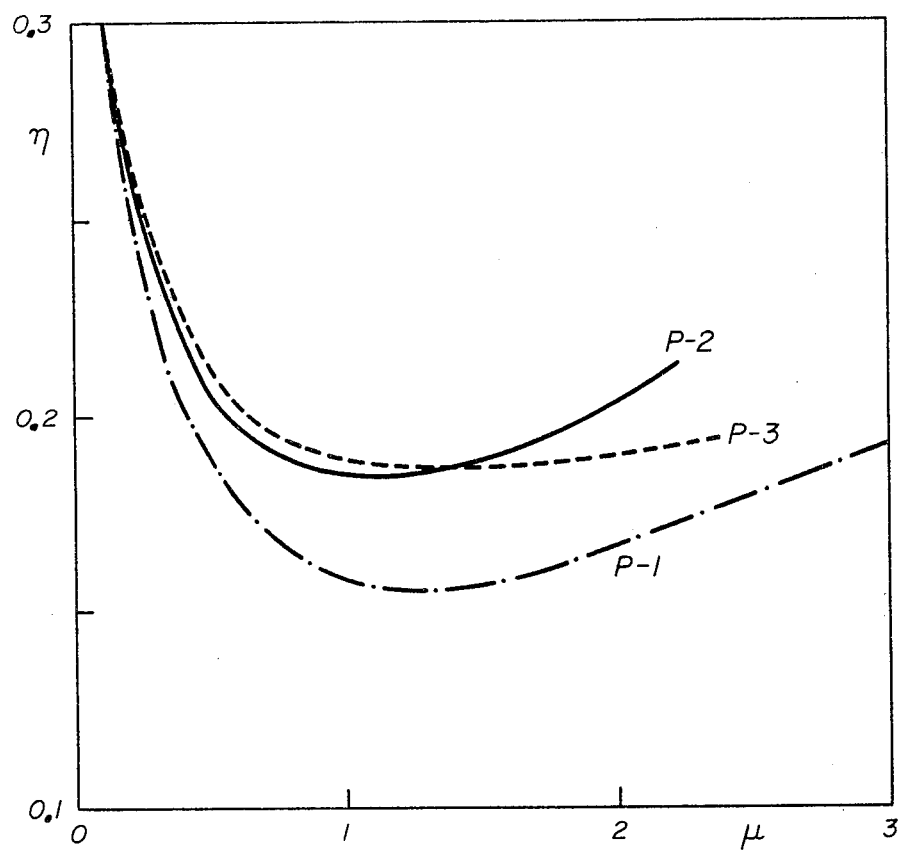
FIG. 5 is a graph showing the variation in the coefficient of friction as a function of the thickness of the deposit and according to the surface preparation state of the substrate before coating.

Moreover, FIG. 5 shows a graph on which the variations in the coefficient of friction (obtained by the Barker pendulum test) have been plotted as a function of the thickness in $\mu$m of the deposit (composition C) on Sandvik 17 AP steel, and for substrates polished according to the methods described hereinbefore (P-1=chain-dotted curve; P-2=continuous curve; P-3=dashed curve). It is surprisingly found that the most slippery coatings are obtained on the roughest substrates. Furthermore, the thickness of the deposits leading to the minimum $\eta$ value is of the order of 1 to 1.5 $\mu$m.

EXAMPLE 2

A batch of escapement wheels of watch movements was selected and the wheels were concentrically stacked on top of one another so as to obtain a cylindrical block with an axial bore. This block was mounted via the central bore on the shaft of a rotational drive device, the plane surfaces of the cylinder being masked on both sides by clamping rings of plastics material. The rotational device, externally rotated by means of a transmission arrangement comprising air-tight joints, was placed as a substrate holder in a cathode sputtering apparatus similar to that described in Example 1. Since the deposit of self-lubricating material was intended to cover the external part of the teeth of the escapement wheels (the region struck by the anchor of the movement), the latter were previously subjected to a fine polishing treatment such as described in the previous example. In certain cases the mechanical polishing was replaced by an electrolytic polishing. After polishing, the parts were degreased and cleaned as described in Example 1.

For the deposits, targets having a composition similar to that of the composition C of Example 1 were used, and gave deposits relatively rich in sulphur and of thicknesses from 1 to 1.5 $\mu$m.

Once the wheels were coated they were used to mount watch and clock movements and these movements were then tested on a GREINER ampliscope, which enabled the amplitude of the movements of the balance-wheel shaft to be determined. The size of this amplitude is in fact a measure of the lubricating quality of the escapement wheels. It was found in all cases that the self-lubricating properties of the coatings obtained according to the invention were better than those of similar deposits obtained by conventional means, in particular by spraying the frictional surfaces with a dispersion of $MoS_2$ in a volatile solvent or deposition by atomization according to Spalvins' technique (cf. the reference given in the introduction).

It will be noted that the self-lubricating coatings according to the invention are also useful on other mechanical parts, and in particular rotating watch and clock parts actuated by oscillation movements or subjected to frictional forces and/or percussive forces, such as for example escapement parts, toothed gears, wheels, pivots, shafts, bearings, ratchets, etc.

EXAMPLE 3

A series of metal chalcogenides listed in the table below was deposited under a pressure of $2 \times 10^{-3}$ mm Hg of argon and a current density of 7 mA/cm². The products used were commercial chalcogenides that had merely been dried in air and had not been purified in any other way. The cathode voltages and the deposition yields are also given in the Table. The lubricating properties of the deposits obtained (approx. 1 μm) on steel were tested by the Baxter pendulum, and the coefficients of friction are also given in the following Table.

TABLE

| Material deposited | Cathode voltage V | Yield g/cm². min($\times 10^{-5}$) | Coefficient of friction |
|---|---|---|---|
| $WS_2$* | 820 | 7.12 | 0.2–0.4 |
| $MoSe_2$* | 620 | 9.6 | 0.08–0.15 |
| $MoTe_2$** | 620 | 12.9 | 0.3, unusable |
| $NbSe_2$* | 670 | 6.3 | 0.1 |
| $TaSe_2$** | 720 | 7.6 | not measurable, non-lubricating |
| $MoS_2$* | 720 | 5.19 | 0.1 |

*TURBOSTRATIC
**AMORPHOUS

We claim:

1. In a process for depositing, by cathode sputtering, a self-lubricating coating of a metal chalcogenide, according to which a target of the material to be sputtered, comprising a chalcogenide or a mixture of chalcogenides, is bombarded with ions formed by a cathode discharge produced in the immediate vicinity of the said target and in a rare gas atmosphere, the materials thus expelled from the target being deposited on a substrate placed opposite the said target, the improvement wherein the cathode space of the said target is subjected to a magnetic field, the distance between the target and the said substrate is adjusted so that it corresponds approximately to the mean free path of the molecules expelled from the target, and the sputtering current density is such that the rate of deposition of the surface of the substrate opposite the said target is at least 0.1 μm/minute, under conditions so as to form turbostratic deposits on the substrate.

2. A process according to claim 1 wherein the magnetic field is from 45 to $100 \times 10^3$ A/m, the said distance between the target and the substrate is 1.5 to 7 cm, and the cathode voltage necessary to produce the said current is 400 to 800 V.

3. A process according to claim 1 wherein the metal chalcogenide is chosen from $MoS_2$, $WS_2$, $MoSe_2$, and, $NbSe_2$.

4. A process according to claim 1 wherein the substrates that are to be coated are subjected, prior to deposition, to a mechanical scouring treatment.

5. A process according to claim 1 wherein, prior to the commencement of the sputtering as such, the substrate is subjected to an ion scouring treatment lasting from 1 to 4 minutes.

6. Mechanical parts covered with a self-lubricating deposit of a metal chalcogenide formed according to the process of claim 1.

7. Parts according to claim 6 wherein the chalcogenide of the coating is either molybdenum disulphide, molybdenum diselenide, or a mixture of these two compounds.

8. Parts according to claim 6 wherein they are escapement movement wheels for watches and clocks, of which at least one region of the surface of the teeth is covered with a deposit of turbostratic $MoS_2$.

9. Parts according to claim 6 wherein they are watch and clock parts that rotate, oscillate, or are subjected to frictional and/or percussive forces, in particular escapement parts, toothed gears, wheels, pivots, shafts, bearings, ratchets.

10. An article comprising a substrate and a self-lubricating coating of a metal chalcogenide of turbostratic structure and long durability when subjected to dry friction.

11. The article defined in claim 7 wherein the turbostratic chalcogenide is $NbSe_2$, $MoS_2$, or $WS_2$ or mixtures thereof.

12. The article defined in claim 7 wherein the thickness of the coating is 0.5 to 3 μm.

* * * * *